US011437557B2

(12) United States Patent
Alias et al.

(10) Patent No.: US 11,437,557 B2
(45) Date of Patent: Sep. 6, 2022

(54) OPTOELECTRONIC SEMICONDUCTOR DEVICE AND METHOD FOR FORMING AN OPTOELECTRONIC SEMICONDUCTOR DEVICE

(71) Applicant: OSRAM Opto Semiconductors GmbH, Regensburg (DE)

(72) Inventors: Asliza Alias, George Town (MY); Lay Sin Khoo, George Town (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 80 days.

(21) Appl. No.: 16/641,602

(22) PCT Filed: Aug. 28, 2017

(86) PCT No.: PCT/EP2017/071558
§ 371 (c)(1),
(2) Date: Feb. 24, 2020

(87) PCT Pub. No.: WO2019/042526
PCT Pub. Date: Mar. 7, 2019

(65) Prior Publication Data
US 2020/0287115 A1 Sep. 10, 2020

(51) Int. Cl.
*H01L 33/54* (2010.01)
*H01L 33/64* (2010.01)
(Continued)

(52) U.S. Cl.
CPC ........ *H01L 33/642* (2013.01); *H01L 25/0753* (2013.01); *H01L 33/501* (2013.01);
(Continued)

(58) Field of Classification Search
CPC combination set(s) only.
See application file for complete search history.

(56) References Cited

U.S. PATENT DOCUMENTS 10,115,871 B2 10/2018 Linkov et al.
2011/0309404 A1* 12/2011 Lee .................. H01L 33/486
257/99
(Continued)

FOREIGN PATENT DOCUMENTS

DE 102015101143 A1 7/2016
WO 2015008243 A1 1/2015

*Primary Examiner* — Ratisha Mehta
(74) *Attorney, Agent, or Firm* — Slater Matsil, LLP

(57) ABSTRACT

An optoelectronic semiconductor device and a method for forming an optoelectronic semiconductor device are disclosed. In an embodiment a device includes a carrier having a main plane of extension, at least one semiconductor chip arranged on the carrier, a frame arranged on the carrier and surrounding the semiconductor chip in lateral directions which are parallel to the main plane of extension of the carrier and a conversion layer covering the at least one semiconductor chip and the frame, wherein the at least one semiconductor chip extends further in a vertical direction than the frame, wherein the semiconductor chip is configured to emit electromagnetic radiation, and wherein the frame and the semiconductor chip are spaced from each other in the lateral directions by a gap.

18 Claims, 3 Drawing Sheets

(51) Int. Cl.
*H01L 25/075* (2006.01)
*H01L 33/50* (2010.01)
*H01L 33/62* (2010.01)

(52) U.S. Cl.
CPC ............ *H01L 33/505* (2013.01); *H01L 33/62* (2013.01); *H01L 33/641* (2013.01); *H01L 2933/0041* (2013.01); *H01L 2933/0066* (2013.01); *H01L 2933/0075* (2013.01)

(56) References Cited

U.S. PATENT DOCUMENTS

| | | | |
|---|---|---|---|
| 2016/0163932 A1* | 6/2016 | Brandl | H01L 33/60 438/29 |
| 2017/0133357 A1* | 5/2017 | Kuo | H01L 25/0753 |
| 2017/0207371 A1 | 7/2017 | Matsunaga | |
| 2018/0040707 A1* | 2/2018 | Park | H01L 21/823431 |

* cited by examiner

OPTOELECTRONIC SEMICONDUCTOR DEVICE AND METHOD FOR FORMING AN OPTOELECTRONIC SEMICONDUCTOR DEVICE

This patent application is a national phase filing under section 371 of PCT/EP2017/071558, filed Aug. 28, 2017.

TECHNICAL FIELD

An optoelectronic semiconductor device and a method for forming an optoelectronic semiconductor device are provided.

SUMMARY OF THE INVENTION

Embodiments provide an optoelectronic semiconductor device with improved optical properties. Further embodiments provide a method for for forming an optoelectronic semiconductor device with improved optical properties.

In at least one embodiment of the optoelectronic semiconductor device, the optoelectronic semiconductor device comprises a carrier having a main plane of extension. The carrier can be a three-dimensional body with the shape of a cuboid. Furthermore, the carrier can extend further within the main plane of extension than in other directions.

The carrier can be a circuit board, i.e., a printed circuit board. For example, the carrier comprises an electrically insulation base body onto and/or into which electrical contact locations and/or circuit paths are applied. As an example, the carrier can comprise silicon or aluminum nitride.

In at least one embodiment the optoelectronic semiconductor device comprises at least one semiconductor chip arranged on the carrier. The semiconductor chip can be an optoelectronic semiconductor chip. The semiconductor chip can be in direct contact with the carrier.

The semiconductor chip can comprise a bottom surface facing the carrier and a top surface facing away from the carrier. Side surfaces of the semiconductor chip can connect the bottom surface and the top surface. The side surfaces can be traverse or perpendicular or approximately perpendicular to the main plane of extension of the carrier. The side surfaces of the semiconductor chip can comprise all surfaces of the semiconductor chip that are neither arranged on a side facing the carrier nor on a side facing away from the carrier.

The semiconductor chip can be electrically contacted by a bonding wire. This means, the semiconductor chip can be electrically contacted at a top side of the semiconductor chip where the top side faces away from the carrier by a bonding wire which is connected to the carrier. Further, the semiconductor chip can be a flip-chip or a surface mountable chip of another kind.

In at least one embodiment the semiconductor chip is configured to emit electromagnetic radiation during operation of the semiconductor device. The semiconductor chip can, for example, be a light-emitting diode or a laser. The semiconductor chip can be configured to emit electromagnetic radiation within a specified wavelength range during operation of the semiconductor device. For example, the semiconductor chip can emit light or electromagnetic radiation in the visible range. Preferably, the electromagnetic radiation emitted by the semiconductor chip leaves the semiconductor chip at the top side. It is further possible that electromagnetic radiation emitted by the semiconductor chip leaves the semiconductor chip at the side surfaces or at all surfaces of the semiconductor chip that are not in contact with the carrier.

In at least one embodiment the optoelectronic semiconductor device comprises a frame which is arranged on the carrier and which surrounds the semiconductor chip in lateral directions which are parallel to the main plane of extension of the carrier. The frame can surround the semiconductor chip in all lateral directions. For example, the frame has the shape of a rectangle with a recess in which the semiconductor chip is arranged. It is also possible that the frame has a shape different from a rectangle with a recess in which the semiconductor chip is arranged.

The frame can be formed by exactly one part. This means, the frame can comprise only one component that completely surrounds the semiconductor chip in lateral directions. It is further possible that the frame is formed by several parts. For example, the frame can comprise several components that have the shape of a rectangle or a stripe. Each of the components can extend in a lateral direction. It is also possible that the components have a shape that is different from a rectangle. The different components can be connected such that they form the frame. This means, the frame can be assembled by connecting different components of the frame.

In at least one embodiment the optoelectronic semiconductor device comprises a conversion layer covering the at least one semiconductor chip and the frame. The conversion layer can be arranged at the top side of the semiconductor chip. Furthermore, the conversion layer can be arranged at the side of the frame that faces away from the carrier. The conversion layer can completely cover the semiconductor chip and the frame at the sides that are not in contact with the carrier. Therefore, the conversion layer can completely cover edges of the semiconductor chip where the edges are formed by the side surfaces and the surface of the semiconductor chip facing away from the carrier. Preferably, the conversion layer has the same or a constant thickness in a vertical direction for the whole semiconductor device where the vertical direction is perpendicular to the main plane of extension of the carrier.

The conversion layer can comprise a transparent or translucent material. This means, the conversion layer can be at least partially transparent for electromagnetic radiation emitted by the semiconductor chip during operation. Therefore, electromagnetic radiation emitted by the semiconductor chip during operation can leave the semiconductor device at a light exit surface of the conversion layer where the light exit surface faces away from the carrier.

The frame can be attached to the carrier before the semiconductor chip is electrically contacted, e.g., via wire bonding. Furthermore, the conversion layer can be deposited on the semiconductor chip and the frame after the semiconductor chip is electrically contacted, e.g., via wire bonding.

In at least one embodiment the at least one semiconductor chip extends further in a vertical direction than the frame, where the vertical direction is perpendicular to the main plane of extension of the carrier. This means, the semiconductor chip can overtop the frame in vertical direction. The semiconductor chip can extend further in vertical direction than the frame at all places.

In at least one embodiment the frame and the semiconductor chip are spaced from each other in lateral directions by a gap. This means, the frame and the semiconductor chip are not in direct contact. The frame and the semiconductor chip can be arranged next to each other in lateral directions on the carrier such that the gap is arranged between the frame and the semiconductor chip in lateral directions. This means, the frame and the semiconductor chip are spaced from each other in lateral directions by a lateral distance. The lateral distance or the lateral extent of the gap can vary along the side surfaces of the semiconductor chip. The gap between the frame and the semiconductor chip can completely surround the semiconductor chip in lateral directions. Therefore, the semiconductor chip can be arranged within a recess of the frame without being in direct contact with the frame.

In at least one embodiment the optoelectronic semiconductor device comprises a carrier having a main plane of extension, and at least one semiconductor chip arranged on the carrier. The optoelectronic semiconductor device further comprises a frame which is arranged on the carrier and which surrounds the semiconductor chip in lateral directions which are parallel to the main plane of extension of the carrier, and a conversion layer covering the at least one semiconductor chip and the frame. The at least one semiconductor chip extends further in a vertical direction than the frame, where the vertical direction is perpendicular to the main plane of extension of the carrier. Furthermore, the semiconductor chip is configured to emit electromagnetic radiation during operation of the semiconductor device, and the frame and the semiconductor chip are spaced from each other in lateral directions by a gap.

Since the frame surrounds the semiconductor chip, the semiconductor chip can be completely covered by the conversion layer at the surfaces that are not in contact with the carrier. Without the frame being arranged around the semiconductor chip the conversion layer would cover the surface of the semiconductor device with a less homogeneous height. This means, with the semiconductor chip having an extension in vertical direction the conversion layer needs to be thick enough in vertical direction in order to cover the semiconductor chip completely at the surfaces that are not in contact with the carrier. However, a smaller thickness of the conversion layer can be advantageous. By arranging the frame around the semiconductor chip the conversion layer is deposited on the frame that has a larger extend in vertical direction than the carrier without the frame. As the extent of the frame in vertical direction is smaller than the extent of the semiconductor chip in vertical direction, the total thickness of the semiconductor device is not increased by arranging the frame around the semiconductor chip.

The frame has the effect that the conversion layer can completely cover the semiconductor chip at the surfaces that are not in contact with the carrier, also at the edges formed by the side surfaces and the surface that faces away from the carrier. Therefore, it is not necessary to increase the thickness in vertical direction of the conversion layer in order to completely cover the semiconductor chip at the surfaces that are not in contact with the carrier. Furthermore, the surface of the conversion layer which faces away from the semiconductor chip and the frame is more uniform in height if the frame surrounds the semiconductor chip. Therefore, the frame acts as a buffer for the conversion layer such that the conversion layer has a more uniform height in vertical direction.

Advantageously, by completely covering the semiconductor chip at the surfaces that are not in contact with the carrier with the conversion layer, the color impression of the electromagnetic radiation emitted by the semiconductor device during operation is homogeneous. This means, the color impression of the electromagnetic radiation emitted by the semiconductor device during operation can be homogeneous for most of or all emission angles. The emission angle is the angle under which electromagnetic radiation is emitted from the semiconductor device in reference to the vertical direction. If, for example, the edges are not completely covered with the conversion layer or the conversion layer is much thinner at the edges than at other places, the color impression might be inhomogeneous. This is because at the edges more of the electromagnetic radiation emitted by the semiconductor chip would be visible. In addition, by completely covering the semiconductor chip at the surfaces that are not in contact with the carrier the brightness of the electromagnetic radiation emitted by the semiconductor device during operation can be homogeneous for most of or all emission angles.

Since the frame can comprise a transparent material the brightness of the electromagnetic radiation emitted by the semiconductor device during operation is not reduced by the frame.

In at least one embodiment the thermal conductivity of the frame is larger than the thermal conductivity of the conversion layer. This means, the thermal conductivity of the material of the frame is larger than the thermal conductivity of the material of the conversion layer. Therefore, heat generated in the semiconductor chip or in the conversion layer can be dissipated by the frame. Consequently, an optical degradation of the conversion layer which can be caused by heat can be reduced. Thus, the lifetime of the semiconductor device can be increased.

In at least one embodiment the semiconductor chip is covered by the conversion layer at all surfaces that are uncovered by the carrier. This means, the semiconductor chip is covered by the conversion layer at all surfaces that are not facing the carrier. In this way, the uniformity of the color impression of the electromagnetic radiation emitted by the semiconductor device during operation can be improved. Furthermore, the uniformity of the brightness of the color impression of the electromagnetic radiation emitted by the semiconductor device during operation can be improved.

In at least one embodiment the frame comprises a glass. Preferably, the glass is transparent for the electromagnetic radiation emitted by the semiconductor chip during operation. The glass can be any glass, for example, sapphire glass. Therefore, the brightness of the electromagnetic radiation emitted by the semiconductor device during operation is not reduced by arranging the frame around the semiconductor chip. Furthermore, the glass can have a thermal conductivity which is larger than the thermal conductivity of the conversion layer.

In at least one embodiment the frame comprises borosilicate glass. Borosilicate glass is transparent for light and its thermal conductivity is larger than the thermal conductivity of materials of the conversion layer.

In at least one embodiment the lateral width of the gap amounts to at least 25 μm and at most 50 μm. The lateral width of the gap can be the distance from the frame to the semiconductor chip in a lateral direction. The lateral width of the gap can be different for different side surfaces of the semiconductor chip. The frame and the semiconductor chip are not in direct contact and spaced from each other by the gap, in order to allow a processing tolerance for placing the semiconductor chip such that it is surrounded by the frame. This means, the semiconductor chip is not required to be placed at an exact position but only at a position with a tolerance of at least 25 μm and at most 50 μm. Furthermore, the lateral width of the gap allows a processing tolerance for the size of the semiconductor chip. This means, the semiconductor chip is not required to have an exact size but only a size with a tolerance of at least 25 μm and at most 50 μm.

It is also possible that the lateral width of the gap amounts to less than 25 μm or more than 50 μm.

In at least one embodiment the frame is in direct contact with the carrier. This means, the frame is directly arranged on the carrier. The frame can be in direct contact with the carrier at a surface of the frame that is parallel to the main plane of extension of the carrier. By arranging the frame on the carrier next to the semiconductor chip it is possible that the semiconductor chip is covered by the conversion layer at all surfaces that are uncovered by the carrier. In this way, the uniformity of the color impression of the electromagnetic radiation emitted by the semiconductor device during operation can be improved. Furthermore, the uniformity of the brightness or the color impression of the electromagnetic radiation emitted by the semiconductor device during operation can be improved.

In at least one embodiment the frame is in direct contact with the conversion layer. Therefore, it is not necessary to increase the thickness in vertical direction of the conversion layer in order to completely cover the semiconductor chip at the surfaces that are not in contact with the carrier. Furthermore, the surface of the conversion layer which faces away from the semiconductor chip and the frame is more homogeneous in height if the frame surrounds the semiconductor chip. Therefore, the frame acts as a buffer for the conversion layer such that the conversion layer has a more uniform height in vertical direction.

In at least one embodiment the conversion layer is configured to convert a wavelength of the electromagnetic radiation emitted by the semiconductor chip. That means that a wavelength of the electromagnetic radiation leaving the conversion layer in a direction facing away from the carrier can be different from the wavelength of the electromagnetic radiation emitted by the semiconductor chip during operation. It is further possible that the conversion layer is configured to convert a range of wavelengths of the electromagnetic radiation emitted by the semiconductor chip. This means, for example, that the semiconductor chip can emit electromagnetic radiation of a first color which is converted into a second color by the conversion layer. Thus, electromagnetic radiation of the second color or of a mixed color mixed from the first and the second color leaves the semiconductor device at the light exit surface. Therefore, by employing the conversion layer the wavelength or the color of the electromagnetic radiation emitted by the semiconductor device can be tuned.

In at least one embodiment conversion particles are dispersed in a matrix material of the conversion layer. This means, the conversion layer can comprise a matrix material and conversion particles. The matrix material is preferably transparent for the electromagnetic radiation which is emitted by the semiconductor chip during operation. The conversion particles are arranged to convert a wavelength of the electromagnetic radiation emitted by the semiconductor chip. Therefore, by employing the conversion layer the wavelength or the color of the electromagnetic radiation emitted by the semiconductor device can be tuned.

In at least one embodiment the matrix material comprises silicone. It is also possible that the matrix material comprises an epoxy resin or a glass material. Advantageously, the matrix material is transparent for the electromagnetic radiation emitted by the semiconductor chip during operation.

In at least one embodiment the optoelectronic semiconductor device comprises at least two semiconductor chips and the frame surrounds each of the semiconductor chips in lateral directions. Therefore, the frame can have the shape of a rectangle with two or more recesses where in each recess a semiconductor chip is arranged. It is also possible that the optoelectronic semiconductor device comprises a plurality of semiconductor chips and that the frame surrounds each of the semiconductor chips in lateral directions. Therefore, the frame can comprise a plurality of recesses where in each recess a semiconductor chip is arranged. The plurality of semiconductor chips can be arranged in a regular or in an irregular array. Thus, one frame and one conversion layer can be employed for a plurality of semiconductor chips.

In at least one embodiment the optoelectronic semiconductor device comprises at least two semiconductor chips and the frame comprises at least two sub-frames, where each sub-frame surrounds at least one semiconductor chip in lateral directions. The sub-frames can be connected with each other. It is further possible that the sub-frames are not connected with each other. It is also possible that the semiconductor device comprises a plurality of semiconductor chips and the frame comprises at least two sub-frames, where each sub-frame surrounds at least one semiconductor chip in lateral directions. Thus, one conversion layer can be employed for a plurality of semiconductor chips.

Furthermore, a method for forming an optoelectronic semiconductor device is provided. Preferably, with the methods described an optoelectronic semiconductor device as described above can be formed. This means that all features disclosed for the optoelectronic semiconductor device are also disclosed for the method for forming an optoelectronic semiconductor device and vice versa.

According to at least one embodiment of the method for forming an optoelectronic semiconductor device the method comprises the step of providing a carrier having a main plane of extension. The carrier can be a circuit board.

According to at least one embodiment of the method, the method comprises the step of attaching at least one semiconductor chip to the carrier. Preferably, a plurality of semiconductor chips is arranged on the carrier. The plurality of semiconductor chips can be arranged in a regular or in an irregular array.

According to at least one embodiment of the method, the method comprises the step of attaching a frame to the carrier, where the frame surrounds the semiconductor chip in lateral directions which are parallel to the main plane of extension of the carrier. The frame can comprise a transparent or translucent material. The frame can be rectangular-shaped. This means, the frame can surround the semiconductor chip in all lateral directions such that the frame has the shape of a rectangle with a recess in which the semiconductor chip is arranged.

According to at least one embodiment of the method, the method comprises the step of depositing a conversion layer covering the semiconductor chip and the frame. The conversion layer can be arranged at a top side of the semiconductor chip where the top side faces away from the carrier. Furthermore, the conversion layer can be arranged at the side of the frame that faces away from the carrier. The conversion layer can completely cover the semiconductor chip and the frame at the sides that are not in contact with the carrier. Therefore, the conversion layer can completely cover edges of the semiconductor chip where the edges are formed by the side surfaces and the surface of the semiconductor chip facing away from the carrier. Preferably, the conversion layer has the same or a constant thickness in vertical direction for the whole semiconductor device where the vertical direction is perpendicular to the main plane of extension of the carrier.

According to at least one embodiment of the method the semiconductor chip extends further in a vertical direction than the frame, where the vertical direction is perpendicular to the main plane of extension of the carrier. This means, the semiconductor chip can overtop the frame in vertical direction. The semiconductor chip can completely extend further in vertical direction than the frame.

According to at least one embodiment of the method the semiconductor chip is configured to emit electromagnetic radiation during operation of the semiconductor device. The semiconductor chip can, for example, be a light-emitting diode or a laser. The semiconductor chip can be configured to emit electromagnetic radiation within a specified wavelength range during operation of the semiconductor device. Preferably, the electromagnetic radiation emitted by the semiconductor chip leaves the semiconductor chip at the top side.

According to at least one embodiment of the method the frame and the semiconductor chip are spaced from each other in lateral directions by a gap. This means, the frame and the semiconductor chip are not in direct contact. The frame and the semiconductor chip can be arranged next to each other in lateral directions on the carrier such that the gap is arranged between the frame and the semiconductor chip in lateral directions. This means, the frame and the semiconductor chip are spaced from each other in lateral directions by a lateral distance. The lateral distance or the lateral extent of the gap can vary along the side surfaces of the semiconductor chip. The gap between the frame and the semiconductor chip can completely surround the semiconductor chip in lateral directions. Therefore, the semiconductor chip can be arranged within a recess of the frame without being in direct contact with the frame.

Since the conversion layer is deposited on top of the semiconductor chip and on top of the frame it is possible that the semiconductor chip can be completely covered by the conversion layer at the side surfaces that are not in contact with the carrier. Therefore, also the edges of the semiconductor chip which are formed by the side surfaces and the surface that faces away from the carrier can be completely covered with the conversion layer. Furthermore, by arranging the frame on the carrier the thickness of the conversion layer covering the semiconductor chip can be more uniform. Therefore, it is not necessary to increase the thickness in vertical direction of the conversion layer in order to completely cover the semiconductor chip at the surfaces that are not in contact with the carrier.

Advantageously, by completely covering the semiconductor chip with the conversion layer at the surfaces that are not in contact with the carrier, the color impression of the electromagnetic radiation emitted by the semiconductor device during operation is homogeneous. This means, the color impression of the electromagnetic radiation emitted by the semiconductor device during operation can be homogeneous for most of or all emission angles. In addition, by completely covering the semiconductor chip at the surfaces that are not in contact with the carrier the brightness of the electromagnetic radiation emitted by the semiconductor device during operation can be homogeneous for most of or all emission angles.

According to at least one embodiment of the method at least one electrical contact of the semiconductor chip is formed via wire bonding before the conversion layer is deposited. The semiconductor chip can be electrically contacted at the top side via a bonding wire. For example, the semiconductor chip can be electrically connected with a further semiconductor chip via wire bonding or with an electrical contact that is arranged on the carrier.

Preferably, the frame is attached to the carrier before the electrical contact of the semiconductor chip is formed. Thus, the electrical contact cannot be impaired during the attachment of the frame. In a later step, the conversion layer is deposited on top of the frame and the semiconductor chip with the electrical contact. In this way, the semiconductor chip can be completely covered by the conversion layer at the surfaces that are not in contact with the carrier.

According to at least one embodiment of the method the thermal conductivity of the frame is larger than the thermal conductivity of the conversion layer. Therefore, heat generated in the semiconductor chip or in the conversion layer can be dissipated by the frame. Consequently, an optical degradation of the conversion layer which can be caused by heat can be reduced. Thus, the lifetime of the semiconductor device can be increased.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION OF ILLUSTRATIVE EMBODIMENTS

Figure 1:
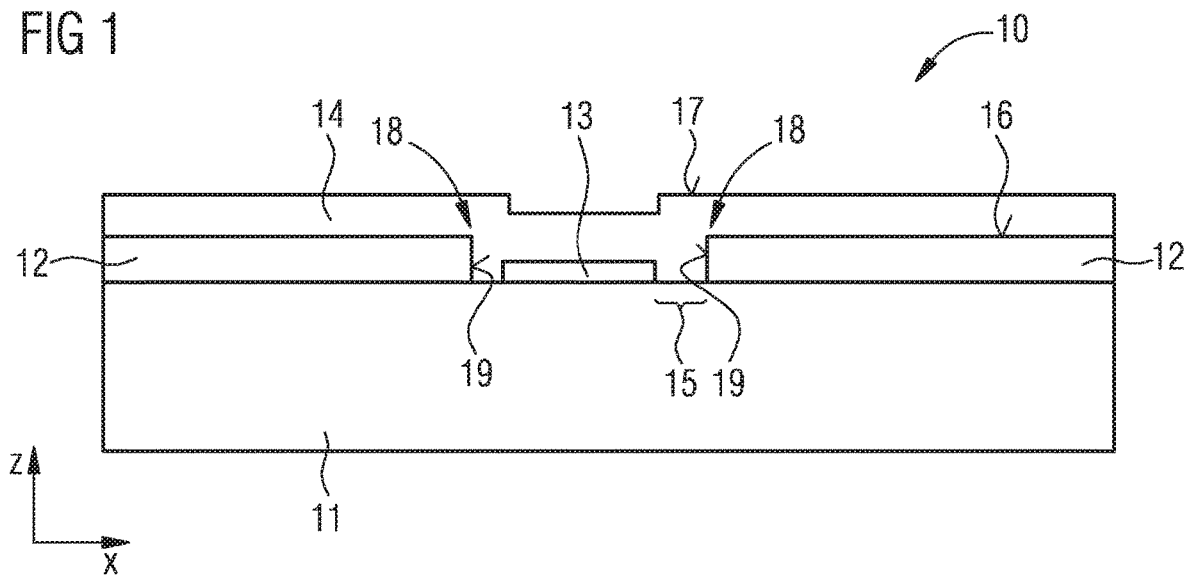
FIG. 1 shows a cutaway view of an exemplary embodiment of the optoelectronic semiconductor device.

In FIG. 1 a cutaway view of an exemplary embodiment of the optoelectronic semiconductor device 10 is shown. The optoelectronic semiconductor device 10 comprises a carrier 11 which can be a printed circuit board or a substrate. A lateral direction x is parallel to the main plane of extension of the carrier 11. Two semiconductor chips 12 are arranged on the carrier 11. The two semiconductor chips 12 are spaced from each other in lateral direction x. The two semiconductor chips 12 can be configured to emit electromagnetic radiation during operation of the semiconductor device 10. For each semiconductor chip 12 a top side 16 is arranged at a side of the semiconductor chip 12 that faces away from the carrier 11. Furthermore, each semiconductor chip 12 comprises side surfaces 19 that are perpendicular to the main plane of extension of the carrier 11.

The semiconductor device 10 further comprises a frame 13. The frame 13 surrounds each semiconductor chip 12 in lateral directions x, y. In FIG. 1 only a section of the frame 13 is depicted. The frame 13 is in direct contact with the carrier 11. Moreover, the frame 13 and each semiconductor chip 12 are spaced from each other in lateral direction x by a gap 15. This means, in lateral direction x a gap 15 is arranged between the semiconductor chip 12 and the frame 13. The frame 13 can be transparent for electromagnetic radiation emitted by the semiconductor chips 12 during operation and the frame 13 can comprise, for example, borosilicate glass. Furthermore, the semiconductor chips 12 extend further in a vertical direction z than the frame 13, where the vertical direction z is perpendicular to the main plane of extension of the carrier 11.

The semiconductor device 10 further comprises a conversion layer 14. The conversion layer 14 covers the semiconductor chips 12 and the frame 13, and the conversion layer 14 is in direct contact with the semiconductor chips 12 and the frame 13. The conversion layer 14 is arranged at a side of the semiconductor chips 12 and the frame 13 that faces away from the carrier 11. The conversion layer 14 can comprise a matrix material and conversion particles. Therefore, the conversion layer 14 can be configured to convert a wavelength of the electromagnetic radiation emitted by the semiconductor chip 12. The matrix material can comprise silicone. The thermal conductivity of the frame 13 can be larger than the thermal conductivity of the conversion layer 14.

The electromagnetic radiation emitted by the semiconductor chips 12 during operation can pass through the conversion layer 14 and leave the semiconductor device 10 via a light exit surface 17 where the light exit surface 17 is arranged at a side of the conversion layer 14 facing away from the carrier 11.

As the frame 13 surrounds the semiconductor chips 12 in lateral directions x, y the conversion layer 14 completely covers the semiconductor chips 12 at the sides of the semiconductor chips 12 that are uncovered by the carrier 11 or not facing the carrier 11. Therefore, also edges 18 of the semiconductor chips 12 that are formed by the side surfaces 19 and the surface facing away from the carrier 11 are covered by the conversion layer 14.

Figure 2:
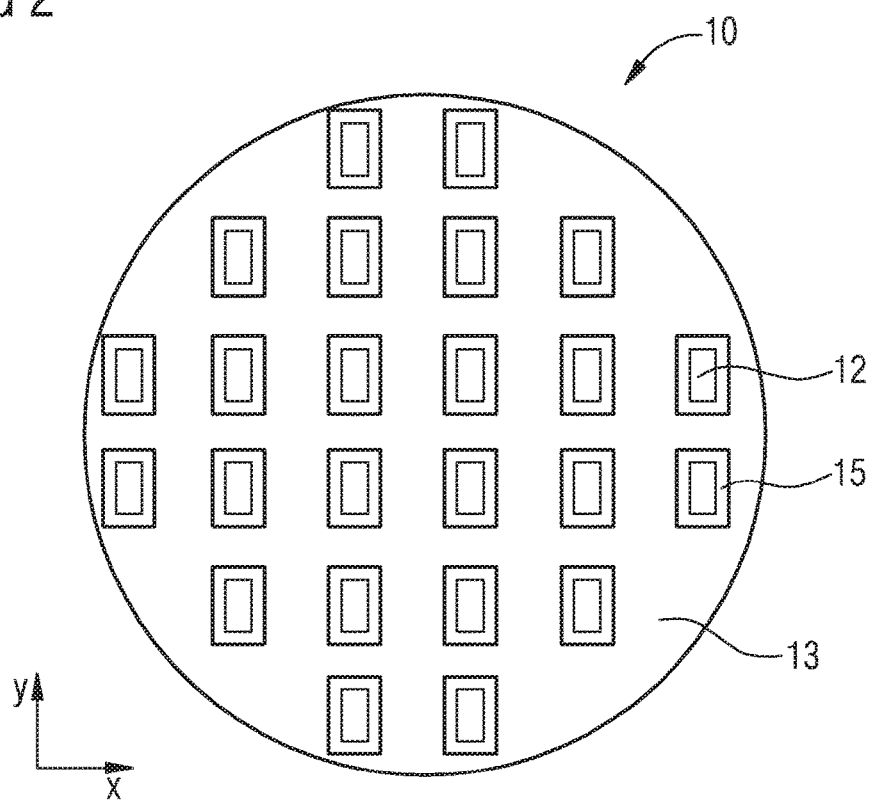
FIG. 2 shows a top view of an exemplary embodiment of the optoelectronic semiconductor device.

In FIG. 2 a top view of an exemplary embodiment of the optoelectronic semiconductor device 10 is shown. The optoelectronic semiconductor device 10 comprises a plurality of semiconductor chips 12 that are arranged in a regular array on the carrier 11. Each semiconductor chip 12 is surrounded by the gap 15 in all lateral directions x, y. Furthermore, each semiconductor chip 12 is surrounded by the frame 13. The frame 13 and the semiconductor chips 12 are not in direct contact as they are spaced from each other by the gap 15. The frame 13 therefore comprises recesses that are rectangular-shaped and in which one semiconductor chip 12 is arranged, respectively.

Figure 3:
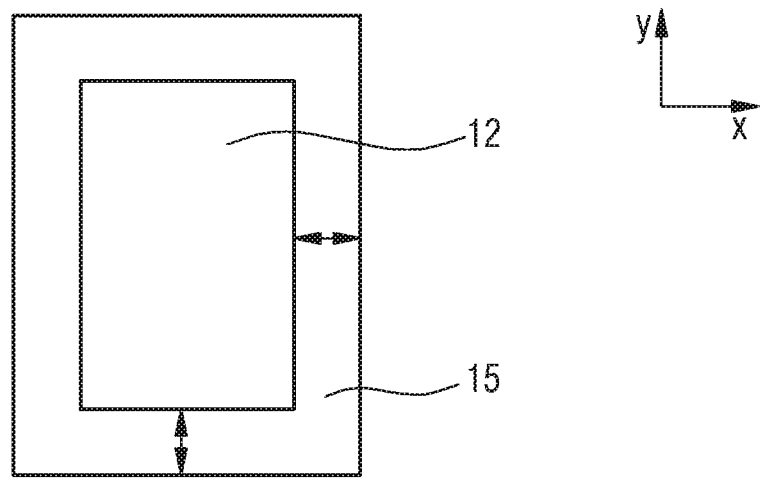
FIG. 3 shows a schematic top view of an exemplary embodiment of a semiconductor chip.

In FIG. 3 a schematic top view of an exemplary embodiment of a semiconductor chip 12 is shown. The semiconductor chip 12 extends in lateral directions x, y. The semiconductor chip 12 is completely surrounded by the gap 15 in lateral directions x, y. The gap 15 can be completely surrounded by the frame 13 in lateral directions x, y which is not shown in FIG. 3. The lateral width or the lateral extent of the gap 15 is given by the distance between the semiconductor chip 12 and the frame 13 in a lateral direction x, y. The lateral width of the gap 15 is marked by two arrows. As shown in FIG. 3 the lateral width of the gap 15 in x-direction can be different from the lateral width of the gap 15 in y-direction where the x-direction and the y-direction are two lateral directions x, y.

Figure 4:
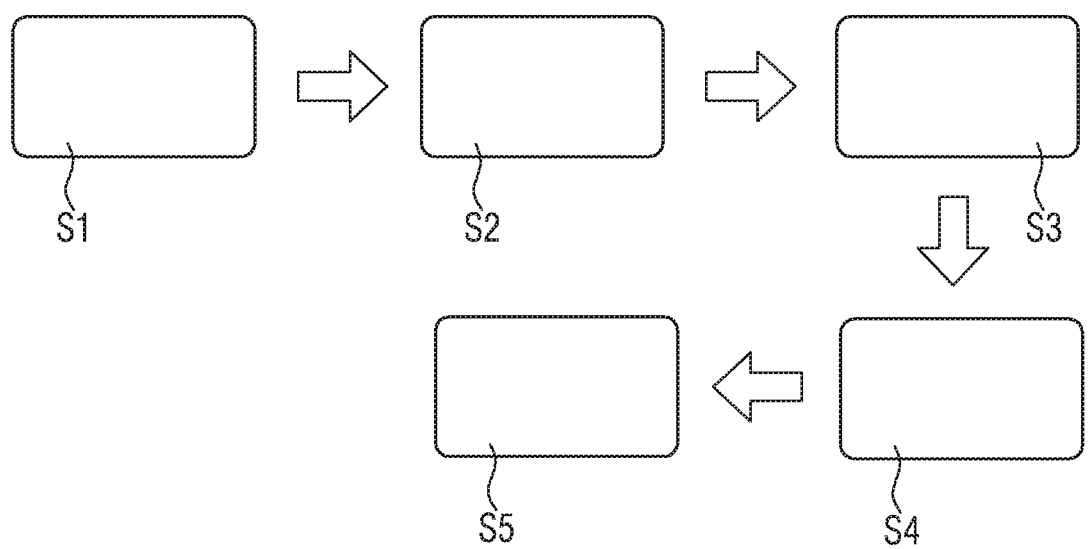
FIG. 4 shows steps of a method for forming an optoelectronic semiconductor device.

With FIG. 4 steps of the method for forming an optoelectronic semiconductor device 10 are explained. In a first step S1 of the method a carrier 11 having a main plane of extension is provided.

At next, in a second step S2 at least one semiconductor chip 12 is attached to the carrier 11. The semiconductor chip 12 is configured to emit electromagnetic radiation during operation of the semiconductor device 10. Preferably, a plurality of semiconductor chips 12 is attached to the carrier 11 in such a way that the semiconductor chips 12 are arranged in a regular array.

In a third step S3 the frame 13 is attached to the carrier 11 such that the frame 13 surrounds the semiconductor chip 12 in lateral directions x, y. Furthermore, the frame 13 is attached to the carrier 11 in such a way that the frame 13 is not in direct contact with the semiconductor chip 12 and that the frame 13 and the semiconductor chip 12 are spaced from each other in lateral directions x, y by the gap 15. Therefore, the frame 13 can, for example, comprise recesses such that one semiconductor chip 12 is arranged within one recess of the frame 13, respectively. Furthermore, the semiconductor chip 12 extends further in vertical direction z than the frame 13. Since the frame 13 and the semiconductor chip 12 are spaced from each other in lateral directions x, y by the gap 15, a variation or a tolerance in the size of the semiconductor chips 12 in the order of the size of the gap 15 is allowed. Furthermore, a variation or a tolerance in the placement of the semiconductor chip 12 at a specified position on the carrier 11 in the order of the size of the gap 15 is allowed. The lateral width of the gap 15 can amount to at least 25 µm and at most 50 µm.

At next, in a fourth step S4 at least one electrical contact of the semiconductor chip 12 is formed via wire bonding. As an example, the plurality of semiconductor chips 12 can be connected with each other via wire bonding. It is also possible that the semiconductor chip 12 is electrically connected with an electrical contact of the carrier 11 via wire bonding. Preferably, the electrical contact of the semiconductor chip 12 is formed at the top side 16 of the semiconductor chip 12.

In a fifth step S5 a conversion layer 14 is deposited on the semiconductor chip 12 and the frame 13. The conversion layer 14 can cover the semiconductor chip 12 and the frame 13 at all surfaces that are not in contact with the carrier 11. Advantageously, because of arranging the frame 13 around the semiconductor chip 12, the semiconductor chip 12 can be completely covered by the conversion layer 14 at the surfaces that are not in contact with the carrier 11.

Figure 5:
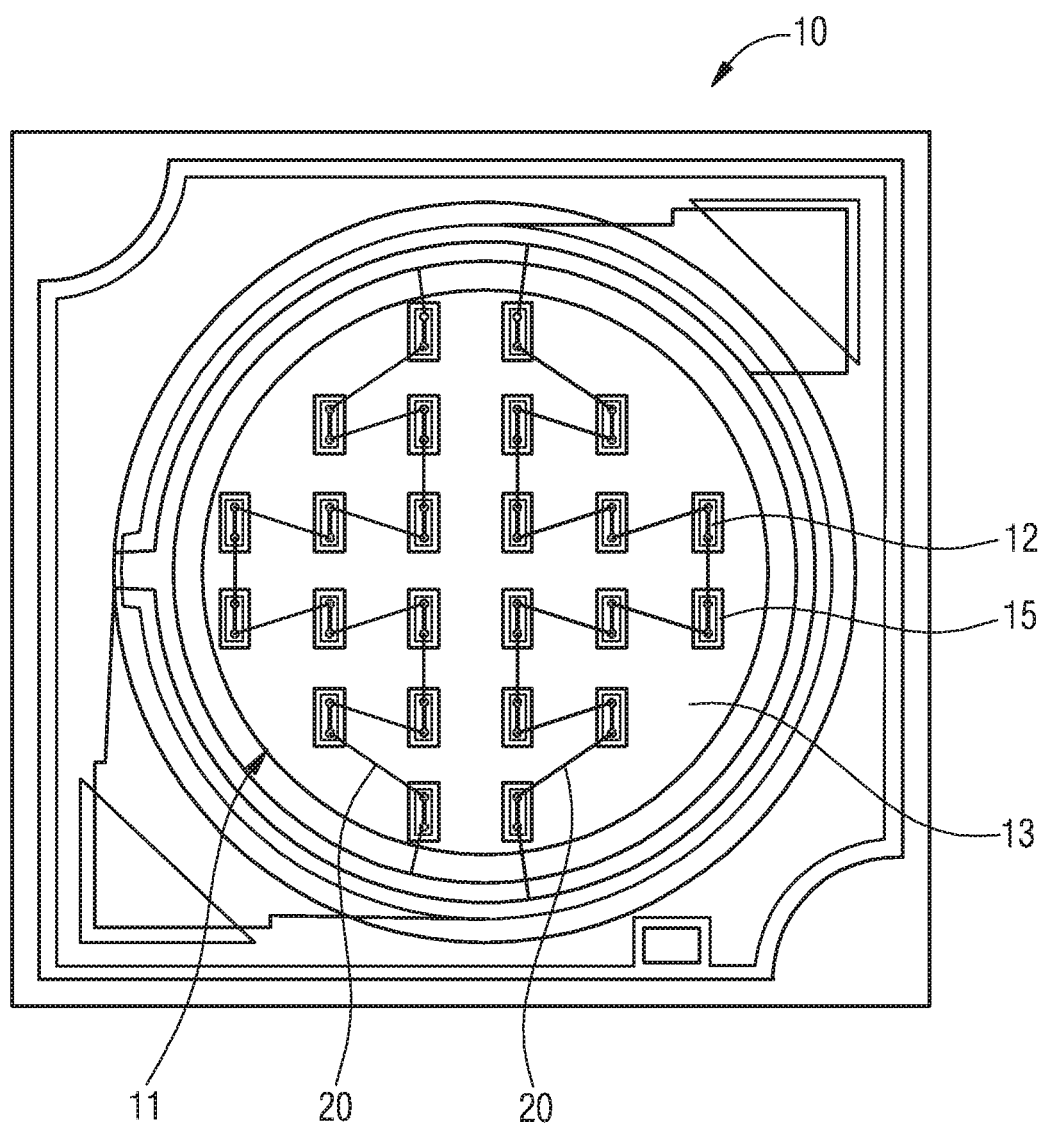
FIG. 5 shows a top view of a further exemplary embodiment of the optoelectronic semiconductor device.

In FIG. 5 a top view of a further exemplary embodiment of the optoelectronic semiconductor device 10 is shown. The setup is similar to the setup shown in FIG. 2. A plurality of semiconductor chips 12 is arranged on the carrier 11. The semiconductor chips 12 are electrically connected with each other via wires 20.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:
1. An optoelectronic semiconductor device comprising:
a carrier having a main plane of extension;
at least one semiconductor chip arranged on the carrier;
a frame arranged on the carrier and surrounding the semiconductor chip in lateral directions which are parallel to the main plane of extension of the carrier; and
a conversion layer completely covering the at least one semiconductor chip and the frame on all surfaces that are uncovered by the carrier,
wherein the at least one semiconductor chip extends further in a vertical direction than the frame, wherein the vertical direction is perpendicular to the main plane of extension of the carrier, wherein the semiconductor chip is configured to emit electromagnetic radiation, and wherein the frame and the semiconductor chip are spaced from each other in the lateral directions by a gap.

2. The optoelectronic semiconductor device according to claim 1, wherein a thermal conductivity of the frame is larger than a thermal conductivity of the conversion layer.

3. The optoelectronic semiconductor device according to claim 1, wherein the frame comprises a glass.

4. The optoelectronic semiconductor device according to claim 1, wherein the frame comprises borosilicate glass.

5. The optoelectronic semiconductor device according to claim 1, wherein a lateral width of the gap amounts to at least 25 μm and at most 50 μm.

6. The optoelectronic semiconductor device according to claim 1, wherein the frame is in direct contact with the carrier.

7. The optoelectronic semiconductor device according to claim 1, wherein the frame is in direct contact with the conversion layer.

8. The optoelectronic semiconductor device according to claim 1, wherein the conversion layer is configured to convert a wavelength of the electromagnetic radiation.

9. The optoelectronic semiconductor device according to claim 1, wherein conversion particles are dispersed in a matrix material of the conversion layer.

10. The optoelectronic semiconductor device according to claim 9, wherein the matrix material comprises silicone.

11. The optoelectronic semiconductor device according to claim 1, wherein the optoelectronic semiconductor device comprises at least two semiconductor chips, and wherein the frame surrounds each of the semiconductor chips in the lateral directions.

12. The optoelectronic semiconductor device according to claim 1, wherein the optoelectronic semiconductor device comprises at least two semiconductor chips and the frame comprises at least two sub-frames, and wherein each sub-frame surrounds at least one semiconductor chip in the lateral directions.

13. A method for forming an optoelectronic semiconductor device, the method comprising:

providing a carrier having a main plane of extension;

attaching at least one semiconductor chip to the carrier;

attaching a frame to the carrier, wherein the frame surrounds the semiconductor chip in lateral directions parallel to the main plane of extension of the carrier; and depositing a conversion layer completely covering the semiconductor chip and the frame on all surfaces that are uncovered by the carrier, wherein the semiconductor chip extends further in a vertical direction than the frame, wherein the vertical direction is perpendicular to the main plane of extension of the carrier, wherein the semiconductor chip is configured to emit electromagnetic radiation, and wherein the frame and the semiconductor chip are spaced from each other in the lateral directions by a gap.

14. The method according to claim 13, further comprising forming at least one electrical contact of the semiconductor chip via wire bonding before depositing the conversion layer.

15. The method according to claim 13, wherein a thermal conductivity of the frame is larger than a thermal conductivity of the conversion layer.

16. The method according to claim 13, wherein the frame comprises borosilicate glass.

17. The method according to claim 13, wherein a lateral width of the gap amounts to at least 25 μm and at most 50 μm.

18. The method according to claim 13, wherein the frame is in direct contact with the carrier, and wherein the frame is in direct contact with the conversion layer.

* * * * *